(12) United States Patent
Ren et al.

(10) Patent No.: US 11,380,713 B2
(45) Date of Patent: Jul. 5, 2022

(54) ARRAY SUBSTRATE AND MANUFACTURING METHOD THEREOF, DISPLAY PANEL

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xingfeng Ren, Beijing (CN); Mingjing Li, Beijing (CN); Mingjian Yu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 16/396,025

(22) Filed: Apr. 26, 2019

(65) Prior Publication Data
US 2020/0091193 A1 Mar. 19, 2020

(30) Foreign Application Priority Data
Sep. 19, 2018 (CN) .......................... 201811093705.7

(51) Int. Cl.
| H01L 27/12 | (2006.01) |
| H01L 27/32 | (2006.01) |
| H01L 23/528 | (2006.01) |
| H01L 23/522 | (2006.01) |

(52) U.S. Cl.
CPC ........ *H01L 27/124* (2013.01); *H01L 23/5221* (2013.01); *H01L 23/5226* (2013.01);
(Continued)

(58) Field of Classification Search
CPC .............. H01L 27/124; H01L 27/1244; H01L 27/3276; H01L 27/3279; H01L 23/5221;
(Continued)

(56) References Cited

U.S. PATENT DOCUMENTS 8,022,898 B2 * 9/2011 Kang .................. G09G 3/3225
345/76
8,336,018 B2 * 12/2012 Turner ................ H01L 23/5286
716/133
(Continued)

FOREIGN PATENT DOCUMENTS

| CN | 102403320 A | 4/2012 |
| CN | 104966721 A | 10/2015 |
(Continued)

OTHER PUBLICATIONS

The First Chinese Office Action dated Mar. 5, 2020; Appln. No. 201811093705.7.

*Primary Examiner* — Yu Chen (57) ABSTRACT

An array substrate, a manufacturing method thereof and a display panel are provided, the array substrate includes a base substrate and a first conductive layer, a first insulating layer, a second conductive layer and a third conductive layer which are sequentially stacked on the base substrate, the first insulating layer insulates the first conductive layer from the second conductive layer, the first conductive layer includes a first signal line, the second conductive layer includes a second signal line and a first connection part spaced apart from each other, the third conductive layer includes a second connection part, the first connection part is electrically connected with the first signal line through a first via hole in the first insulating layer; the second connection part is electrically connected with the first connection part and the
(Continued)

second signal line to constitute a connection structure electrically connecting the first signal line with the second signal line.

18 Claims, 5 Drawing Sheets

(52) U.S. Cl.
CPC ...... *H01L 23/5283* (2013.01); *H01L 23/5286* (2013.01); *H01L 27/1244* (2013.01); *H01L 27/3213* (2013.01); *H01L 27/3276* (2013.01); *H01L 27/3279* (2013.01)

(58) Field of Classification Search
CPC ............. H01L 23/5226; H01L 23/5283; H01L 23/5286; H01L 21/76895; G02F 1/136286
See application file for complete search history.

(56) References Cited

U.S. PATENT DOCUMENTS

| | | | | |
|---|---|---|---|---|
| 2002/0024143 | A1* | 2/2002 | Or-Bach | H03K 19/17792 |
| | | | | 257/758 |
| 2003/0076046 | A1* | 4/2003 | Komiya | H01L 27/3276 |
| | | | | 315/169.3 |
| 2003/0201472 | A1* | 10/2003 | Ho | H01L 23/5225 |
| | | | | 257/207 |
| 2004/0214389 | A1* | 10/2004 | Madurawe | G11C 11/412 |
| | | | | 438/202 |
| 2014/0252644 | A1* | 9/2014 | O'Brien | H01L 23/528 |
| | | | | 257/774 |
| 2015/0214246 | A1* | 7/2015 | Wu | H01L 27/124 |
| | | | | 257/347 |
| 2017/0110091 | A1* | 4/2017 | Huang | G09G 3/20 |
| 2017/0207240 | A1* | 7/2017 | He | H01L 27/124 |
| 2018/0040567 | A1* | 2/2018 | Yu | H01L 23/50 |
| 2018/0158840 | A1* | 6/2018 | Chen | H01L 27/124 |
| 2019/0066561 | A1* | 2/2019 | Yuan | G09G 3/20 |

FOREIGN PATENT DOCUMENTS

| | | | | |
|---|---|---|---|---|
| CN | 108231798 A | | 6/2018 | |
| KR | 20160032391 A | * | 3/2016 | ........... H01L 27/124 |

* cited by examiner

ARRAY SUBSTRATE AND MANUFACTURING METHOD THEREOF, DISPLAY PANEL

This application claims the benefit of Chinese patent application No. 201811093705.7 filed on Sep. 19, 2018, which is hereby entirely incorporated by reference as a part of the present application.

TECHNICAL FIELD

Embodiments of the present disclosure relate to an array substrate, a manufacturing method of the array substrate, and a display panel.

BACKGROUND

In the display field, organic light-emitting diode (OLED) display panels have characteristics of self-illumination, high contrast, low power consumption, wide viewing angle, fast response, being applicable for flexible panels, wide service temperature range, simple manufacturing and the like, and have broad development prospects. How to optimize a manufacturing process of the display panel is a problem focused in the field.

SUMMARY

At least one embodiment of the present disclosure provides array substrate, including a base substrate and a first conductive layer, a first insulating layer, a second conductive layer, and a third conductive layer which are sequentially stacked on the base substrate, and the first insulating layer insulates the first conductive layer from the second conductive layer. The first conductive layer includes a first signal line, the second conductive layer includes a second signal line and a first connection part which are spaced apart from each other, and the third conductive layer includes a second connection part. The first connection part is electrically connected with the first signal line through a first via hole in the first insulating layer; the second connection part is electrically connected with the first connection part and the second signal line, to constitute a connection structure electrically connecting the first signal line with the second signal line.

In some examples, the array substrate further includes a second insulating layer between the second conductive layer and the third conductive layer, and the second connection part is electrically connected with the first connection part through a second via hole and with the second signal line through a third via hole, respectively, and the first via hole and the second via hole are in the second insulating layer.

In some examples, the first signal line and the second signal line belong to a first power supply line, and the first power supply line is configured to provide a power supply voltage; or the first signal line and the second signal line belong to a common electrode line, and the common electrode line is configured to provide a common voltage.

In some examples, the first connection part includes two sub-connection parts, and the two sub-connection parts are respectively at two sides of the second signal line.

In some examples, the first conductive layer includes a plurality of first signal lines extended in a first direction, and the second conductive layer includes a plurality of second signal lines extended in a second direction; the plurality of first signal lines and the plurality of second signal lines overlap each other at overlap positions, respectively, in a direction perpendicular to the base substrate, and the connection structure is provided at each of the overlap positions; the second direction intersects the first direction.

In some examples, the array substrate further includes a second insulating layer between the second conductive layer and the third conductive layer; for the connection structure, the second connection part is electrically connected with the first connection part through a second via hole and with the second signal line through a third via hole, respectively, and the second via hole and the third via hole are in the second insulating layer.

In some examples, the array substrate farther includes a plurality of sub-pixels arranged in a plurality of rows along the first direction and a plurality of columns along the second direction. The plurality of first signal lines and the plurality of second signal lines belong to a first power supply line which is configured to provide a power supply voltage for the plurality of sub-pixels; or the plurality of first signal lines and the plurality of second signal lines belong to a common electrode line which is configured to provide a common voltage for the plurality of sub-pixels.

In some examples, the array substrate further includes a plurality of sub-pixels arranged in a plurality of rows along the first direction and a plurality of columns along the second direction, each sub-pixel includes a thin film transistor, and the first signal line and the second signal line are electrically connected with a source electrode or a drain electrode of the thin film transistor.

In some examples, each sub-pixel further includes a pixel electrode, and the third conductive layer further includes the pixel electrode, In some examples, for the connection structure, the first connection part includes two sub-connection parts, and the two sub-connection parts are respectively at two sides of the second signal line.

In some examples, the array substrate further includes a plurality of sub-pixels arranged in a plurality of rows along the first direction and a plurality of columns along the second direction, the first conductive layer further includes a plurality of scan lines extended along the first direction, and the plurality of scan lines are configured to respectively provide scan signals to the plurality of rows of sub-pixels.

In some examples, the array substrate further includes a plurality of sub-pixels arranged in a plurality of rows along the first direction and a plurality of columns along the second direction, the second conductive layer further includes a plurality of data lines extended along the second direction, and the plurality of data lines are configured to respectively provide data signals to the plurality of columns of sub-pixels.

In some examples, the second connection part is electrically connected with the first connection part and the second signal line through direct contact by overlapping without via holes.

At least one embodiment of the present disclosure further provides a manufacturing method of an array substrate, including: forming a first conductive layer on a base substrate, wherein the first conductive layer includes a first signal line; for a first insulating layer on the first conductive layer and a first via hole in the first insulating layer; forming a second conductive layer on the first insulating layer, wherein the second conductive layer includes a second signal line and a first connection part which are spaced apart from each other, and the first connection part is electrically connected with the first signal line through the first via hole; and forming a third conductive layer on the second conductive layer, wherein the third conductive layer includes a second connection part, and the second connection part is electrically connected with the first connection part and the second signal line, respectively, to constitute a connection structure electrically connect the first signal line with the second signal line.

In some examples, the manufacturing method farther includes: forming a second insulating layer between the second conductive layer and the third conductive layer, and forming a second via hole and a third via hole in the second insulating layer, wherein the second connection part is electrically connected with the first connection part through the second via hole and with the second signal line through the third via hole, respectively.

In some examples, the manufacturing method further includes: detecting by an electrical detection manner whether the second signal line is abnormal after forming the second conductive layer and before forming the third conductive layer; and repairing the second signal line in a situation where the second signal line is abnormal.

In some examples, detecting whether the second signal line is abnormal includes: inputting a signal at an end of the second signal line; detecting an output signal at another end of the second signal line; in a situation where the output signal is smaller than a predetermined value, determining that the second signal line is abnormal.

In some examples, the first conductive layer includes a plurality of first signal lines extended in a first direction, and the second conductive layer includes a plurality of second signal lines extended in a second direction; the plurality of first signal lines and the plurality of second signal lines overlap each other at overlap positions, respectively, in a direction perpendicular to the array substrate, and the connection structure is formed at each of the overlap positions; the second direction intersects the first direction.

In some examples, the manufacturing method further includes forming a plurality of sub-pixels arranged in a plurality of rows along the first direction and a plurality of columns along the second direction, and the first conductive layer further includes a plurality of extended in the first direction a scan line. The plurality of scan lines respectively provide scan signals for the plurality of rows of sub-pixels.

In some examples, the manufacturing method further includes forming a plurality of sub-pixels arranged in a plurality of rows along the first direction and a plurality of columns along the second direction. Each of the sub-pixels includes a pixel electrode, and the pixel electrode and the second connection part are formed in a same layer and in the third conductive layer.

At least one embodiment of the present disclosure provides a display panel including any one array substrate described above.

BRIEF DESCRIPTION OF THE DRAWINGS

In order to clearly illustrate the technical solutions of the embodiments of the disclosure, the drawings of the embodiments or related techniques will be briefly described in the following; it is obvious that the described drawings are only related to some embodiments of the disclosure and thus are not limitative of the disclosure.

DETAILED DESCRIPTION

The technical solutions of the embodiments of the present disclosure will be described in a clearly and fully understandable way in connection with the drawings. With reference to the nonrestrictive exemplary embodiments shown in the drawings and detailed in the following description, the exemplary embodiments of the present disclosure and their various features and advantageous details are more fully explained. It should be noted that the features shown in the figures are not necessarily drawn to scale. The disclosure omits the descriptions of known materials, components and process techniques so as not to cloud the exemplary embodiments of the present disclosure. The examples are given only to facilitate an understanding of the implementation of the exemplary embodiments of the present disclosure, and to enable those skilled in the art to practice the exemplary embodiments. Therefore, the examples are not to be construed as limitative of the scope of the embodiments of the present disclosure.

Unless otherwise defined, all the technical and scientific terms used in the present disclosure have the meanings as commonly understood by one of ordinary skill in the art to which the present disclosure belongs. The terms "first," "second," etc., which are used in the present disclosure, are not intended to indicate any sequence, amount or importance, but distinguish various components. In addition, in the various embodiments of the present disclosure, the same or similar reference numerals denote the same or similar components.

The OLED display panel generally includes a plurality of sub-pixels arranged in an array, each sub-pixel includes a pixel circuit and an OLED light-emitting element, and the pixel circuit can drive the OLED light-emitting element to emit light of a predetermined intensity at a predetermined time based on a received data signal and a received scan signal.

Figure 1A:
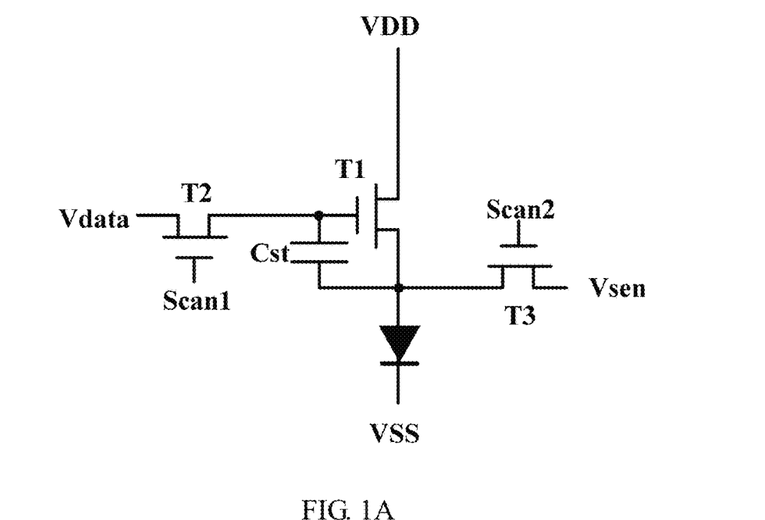
FIG. 1A is a diagram of an OLED pixel circuit.

FIG. 1A shows a 3T1C pixel circuit which is used in the OLED display panel, has a detection function and includes a driving transistor T1, a switching transistor T2, a detection transistor T3 and a storage capacitor Cst. The switching transistor T2 has a gate electrode connected with a first scan line (gate line) to receive a first scan signal Scan1, has a drain electrode connected with a data line to receive a data signal Vdata and has a source electrode connected with a gate electrode of the driving transistor T1; the driving transistor T1 is has a drain electrode connected with a first power supply terminal (VDD, high voltage terminal) through a first power supply line to receive a first power supply voltage (high voltage), and has a source electrode connected with a positive electrode terminal of the OLED light-emitting element; the storage capacitor Cst has a first electrode connected with both the source electrode of the switching transistor T2 and the gate electrode of the driving transistor T1 and has a second electrode connected with the source electrode of the driving transistor T1 and the positive electrode terminal of the OLED light-emitting element; and a negative electrode of the OLED light-emitting element is connected with a second power supply terminal (VSS, low voltage terminal) through a second power supply line to receive a second power supply voltage (low voltage), for example, the negative electrode is grounded; the detection transistor T3 has a gate electrode connected with a second scan line to receive a second scan signal Scan2, has a source electrode connected with the positive electrode terminal of the OLED light-emitting element, and has a drain electrode connected with a detection line to receive a detection signal Vsen. A working process of the pixel circuit is as follows. In a writing phase, the first scan signal Scan1 and the second scan signal Scan2 are both switch-on signals, the data signal Vdata is transmitted to the gate electrode of the driving transistor T1 and the first electrode of the storage capacitor Cst via the switching transistor T2, and the detection signal Vsen is transmitted to the source electrode of the driving transistor T1 and the second electrode of the storage capacitor Cst via the detection transistor T3. A driving current is generated in the driving transistor T1 and charges the second electrode of the storage capacitor Cst to a voltage of Vdata-Vth under the action of the first power supply voltage VDD, and Vth is a threshold voltage of the driving transistor T1. In this situation, the driving transistor T1 is turned from an on state to an off state. In a detection phase, the first scan signal Scan1 and the second scan signal San2 are both switch-on signals, and the saturation voltage Vdata-Vth at the source electrode of the driving transistor T1 (i.e., the second electrode of the storage capacitor Cst) is sampled via the detection line, and thereby the threshold voltage of the driving transistor T1 is obtained.

It should be noted that, in the description of the embodiments of the present disclosure, the symbols VDD and VSS may represent both the power supply terminals and the power supply voltages provided by the power supply terminals.

In manufacturing the OLED display panel, in order to reduce resistances of conducting lines and thereby reduce a voltage drop of the conducting lines to uniformly supply the power supply voltage throughout the display panel, power supply lines in a mesh structure may be formed, and the mesh structure is usually formed by forming horizontal power supply lines and vertical power supply lines respectively in two conductive layers, and then electrically connecting the horizontal power supply lines with the vertical power supply lines at a plurality of intersecting positions. After this process, it is also needed to detect and repair the signal lines in each conductive layer.

Figure 1B:
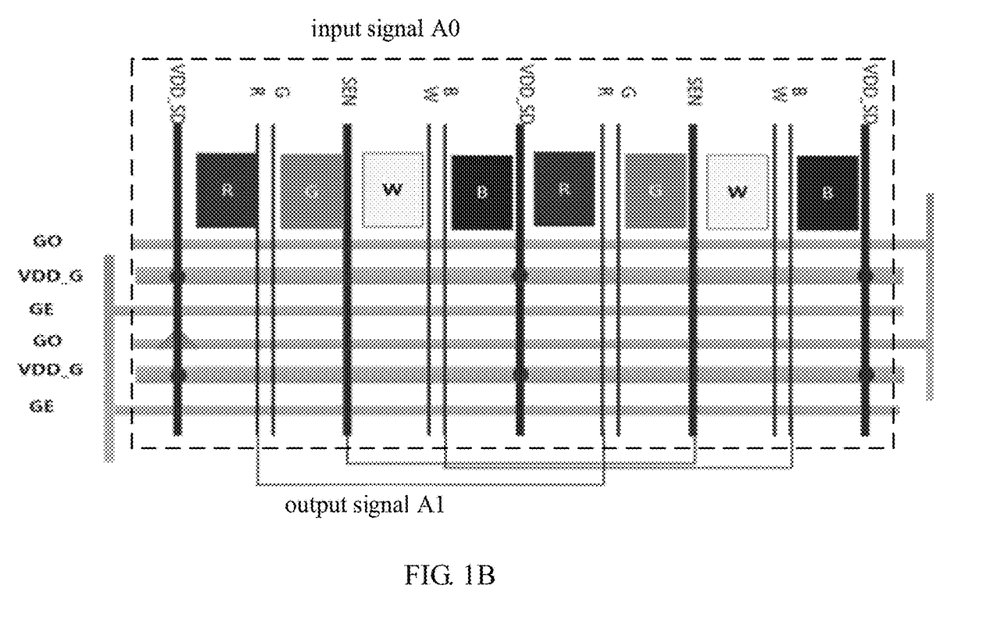
FIG. 1B is a schematic plan view of an array substrate of an OLED display panel.

FIG. 1B is a schematic plan view of an array substrate of the OLED display panel, the figure schematically shows a distribution of the power supply lines in the OLED display panel, and blocks marked with R, G, B and W schematically illustrate sub-pixels but do not represent actual positions of the sub-pixels in the panel. As shown in FIG. 1B, a gate metal layer including horizontally extended gate lines (GO/GE) and gate-layer power supply lines (VDD_G) is formed firstly; an insulating layer is formed on the gate metal layer after signal lines in the gate metal layer are detected and repaired; then a source/drain metal layer including vertically extended data lines (data lines for R, G and B sub-pixels as shown in the figure), detection lines SEN and source/drain-layer power supply lines (VDD_SD) are formed on the insulating layer, and the source/drain-layer power supply lines are electrically connected with the gate layer power supply lines at intersecting positions through via holes in the insulating layer (at dots as shown in the figure), thereby forming the power supply lines arranged in a mesh structure; then, various signal lines in the source/drain metal layer are detected and repaired. For example, by comparing values of input signals A0 respectively input to the various signal lines with values of output signals A1 respectively obtained from the various signal lines, whether the signal lines are abnormal may be judged. For example, if there is a short circuit abnormity at the signal line (for example, at a triangle shown in the figure), the input signal would disperse via a short circuit path, so that the detected output signal A1 is significantly smaller than the input signal A0, and thereby the signal line is judged to be abnormal and is repaired accordingly. For example, the inside of the dotted line frame in FIG. 1B is a panel region, and the outside of the dotted line frame is a detection region for forming detection lines; after the panel is completed, the detection region outside the dotted line frame may be removed by mechanical cutting, laser cutting, or the like.

The inventor finds that, in the manufacturing process of the array substrate of the display panel of the structure shown in FIG. 18, because the source/drain-layer power supply lines (VDD_SD) are already in a short circuit state with the gate-layer power supply lines (VDD_G) after the source/drain layer power supply lines (VDD_SD) are formed, and the signals A0 applied to the source/drain layer power supply lines are dispersed via the gate electrode-layer power supply lines, causing whether an abnormity such as a short circuit or an open circuit exists in the source/drain-layer power supply lines cannot be judged by detecting the values of the output signals A1. This causes detecting and repairing the abnormity of the source/drain layer power supply lines cannot be timely conducted during the manufacturing process of the panel, which greatly affects a yield of the product and increases a production cost of the product.

Figure 2:
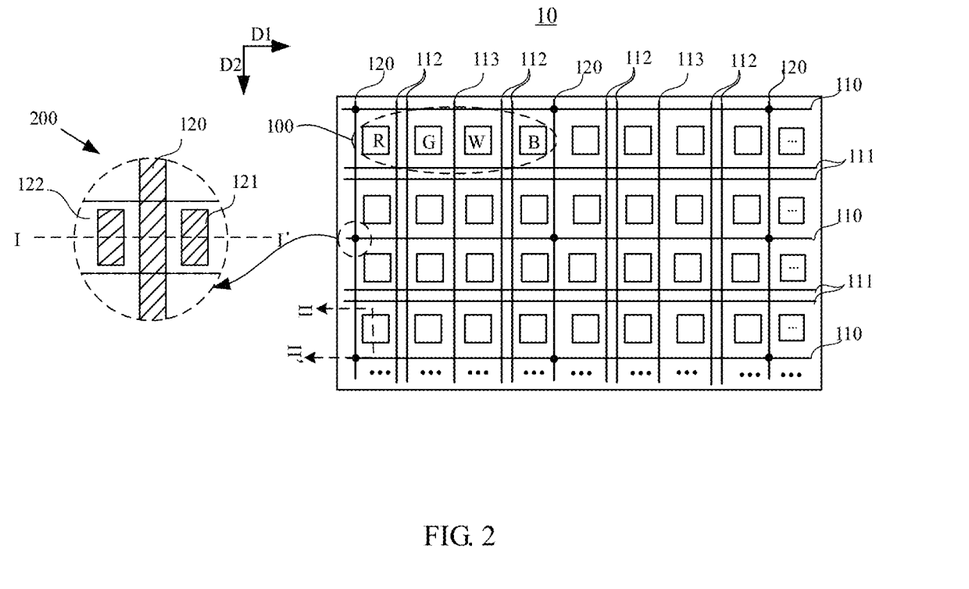
FIG. 2 is a schematic plan view of an array substrate provided by an embodiment of the present disclosure.

FIG. 2 is a schematic plan view of an array substrate provided by at least one embodiment of the present disclosure. As shown in the figure, the array substrate 10 includes a plurality of sub-pixels arranged in a plurality of rows along the first direction D1 and a plurality of columns along the second direction D2, that is, the array substrate 10 includes a sub-pixel array, and the first direction D1 and the second direction 132 intersect with each other. Every m sub-pixels form one pixel unit 100, the in sub-pixels respectively emit light of different color (basic color), for example, to realize color display, and for example, m=2, 3 or 4. For example, as shown in the figure, one pixel unit 100 includes four sub-pixels that emit red (R), green (G), blue (B) and white (W) light, respectively. In another example, for example, one pixel unit 100 includes three sub-pixels, and the three sub-pixels emit red (R), green (G) and blue (B), respectively.

The array substrate 10 farther includes a plurality of first signal lines 110 extended in the first direction D1 and a plurality of second signal lines 120 extended in the second direction D2. The plurality of first signal lines 110 and the plurality of second signal lines 120 overlap each other at overlap positions, respectively, in a direction perpendicular to the base substrate 101, and a connection structure 200 is provided at each overlap position so that the first signal lines 110 and the second signal lines 120 are electrically connected with each other to form a conductive mesh structure. For example, the first signal lines 110 and the second signal lines 120 are power supply lines respectively located in different layers and are electrically connected with each other to form the conductive mesh structure.

Figure 3:
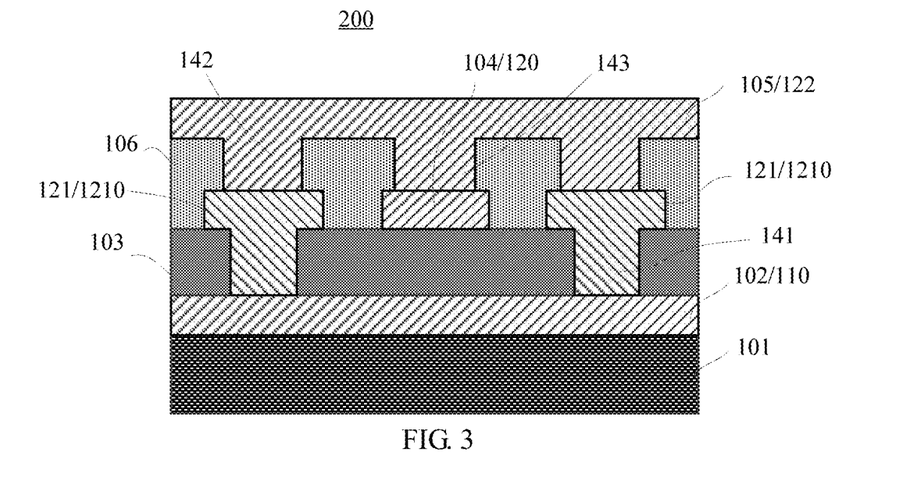
FIG. 3 is a cross-sectional view taken along line I-I' in the partially enlarged schematic view of FIG. 2.

The left side of FIG. 2 shows an enlarged schematic view of the connection structure 200, and FIG. 3 is a cross-sectional view taken along line I-I' in the partially enlarged schematic view of FIG. 2. As shown in FIG. 2 and FIG. 3, a first conductive layer 102, a first insulating layer 103, a second conductive layer 104 and a third conductive layer 105 are sequentially stacked on a base substrate 101, and the first insulating layer 103 enables the first conductive layer 102 and the second conductive layer 104 to be spaced apart and insulated from each other. The first conductive layer 102 includes the first signal lines 110; the second conductive layer 104 includes the second signal lines 120 and at least one first connection part 121 which are spaced apart from each other; and the third conductive layer 105 includes a second connection part 122. The first connection part 121 is electrically connected with the first signal line 110 through a first via hole 141 in the first insulating layer 103; the second connection part 122 is electrically connected with the first connection part 121 and the second signal line 120 to form the connection structure 200 which electrically connects the first signal line 110 with the second signal line 120.

For example, as shown in FIG. 3, the array substrate 10 further includes a second insulating layer 106 disposed between the second conductive layer 104 and the third conductive layer 105, and the second connection part 122 is electrically connected with the first connection part 121 and the second signal line 120 through a second via hole 142 and a third via hole 143 in the second insulating layer 106, respectively.

For example, in another example, the second connection part 122 may also be electrically connected with the first connection part 121 and the second signal line 120 through direct contact by overlapping without via holes, in which situation no insulating layer is disposed between the second connection part 122 and the second conductive layer 104.

For example, as shown in FIG. 2 and FIG. 3, the first connection part 121 includes two sub-connection parts 1210, and the two sub-connection parts 1210 are respectively disposed on two sides of the second signal line 120. For example, the two sub-connection parts 1210 are symmetrically disposed with respect to the second signal line 120.

The application of the array substrate 10 is not limited in the embodiments of the present disclosure. In some examples, the array substrate 10 is an organic light-emitting diode (OLED) array substrate for an OLED display panel. In this array substrate 10, the first signal lines 110 and the second signal lines 120 are, for example, signal lines for supplying a power supply voltage. For example, the first signal lines 110 and the second signal lines 120 belong to a power supply line that is configured to supply a high power supply voltage (VDD) or a low power supply voltage (VSS) to the sub-pixels. For example, the first signal lines 110 and the second signal lines 120 are electrically connected with power supply terminals (such as VDD or VSS in FIG. 1A), so as to allow the power supply terminals to provide the sub-pixels with the high power supply voltage or the low power supply voltage through the first signal lines 110 and the second signal lines 120. For example, the power supply terminals may be disposed in a non-display region of the array substrate 10. For example, referring to FIG. 1A, each sub-pixel includes a thin film transistor (for example, the driving transistor T1), and the first signal line 110 and the second signal line 120 are electrically connected with a source electrode or a drain electrode of the thin film transistor.

In other examples, the array substrate 10 may also be an array substrate applied to a liquid crystal display panel, and the first signal lines 110 and the second signal lines 120 are, for example, signal lines for supplying a common voltage. For example, the first signal lines 110 and the second signal lines 120 belong to a common electrode line that is configured to supply a common voltage (Vcom) to the sub-pixels. For example, the first signal lines 110 and the second signal lines 120 are electrically connected with common voltage terminals, so as to allow the common voltage terminals to provide the sub-pixels with the common voltage (Vcom) through the first signal lines 110 and the second signal lines 120.

For example, in the first direction D1, one second signal line 120 may be disposed for every one or more columns of pixel units 100. For example, as shown in the figure, one second signal line 120 is disposed between every adjacent two pixel units 100.

For example, as shown in the figure, in the second direction D2, one first signal line 110 may be disposed for every two rows of sub-pixels, and two rows of pixel units adjacent to each first signal line 110 may be connected to the each first signal line 110 to share the each first signal line.

For example, the first conductive layer 102 further includes a plurality of scan lines 111 extended along the first direction D1 and are connected in one-to-one correspondence with the plurality of rows of pixel units 100 to provide scan signals for the plurality of rows of sub-pixels. In this example, the first signal lines 110 and the scan lines 111 are disposed in a same layer. For example, referring to FIG. 1A, each sub-pixel includes a thin film transistor (e.g., the switching transistor T2), and each scan line 111 is electrically connected with the gate electrode of this thin film transistor in the sub-pixels in one row of pixel units 100 corresponding to the each scan line 111, so as to provide the sub-pixels with the scan signal.

For example, the second conductive layer 104 further includes a plurality of data lines 112 extended along the second direction 112 and are connected in one-to-one correspondence with the plurality of columns of sub-pixels to provide data signals for the plurality of columns of sub-pixels. In this example, the second lines 120 and the data lines 112 are disposed in a same layer. For example, referring to FIG. 1A, each sub-pixel includes a thin film transistor (such as the switching transistor T2), and each data line 112 is electrically connected with the source electrode or the drain electrode of this thin film transistor in the sub-pixels of one row of pixel units 100 corresponding to the each data line 112, so as to provide the sub-pixels with the data signal.

It should be noted that the source electrode and drain electrode of the thin film transistor are structurally symmetrical and therefore interchangeable as needed.

For example, in the case where the array substrate 10 is the organic light-emitting diode (OLED) array substrate, the array substrate 10 may further include a detection line 113 and the like.

For example, each sub-pixel includes a pixel electrode, and the third conductive layer further includes the pixel electrode. In this example, the second connection part 122 and the pixel electrode are disposed in a same layer in the third conductive layer.

It should be noted that "disposed in a same layer" in the present disclosure means that a plurality of structures are formed of a same material layer on the base substrate and through a same or different patterning processes.

For example, the base substrate 101 may be an inorganic substrate (such as glass, quartz, sapphire, silicon wafer, etc.) or an organic flexible substrate (such as polyimide (PI), polyethylene terephthalate (PET), polycarbonate, polyethylene, polyacrylate, polyetherimide, polyethersulfone, etc.), which is included by but not limited to the embodiments of the present disclosure.

For example, the first insulating layer 103 and the second insulating layer 106 may include an inorganic insulating material, for example, silicon oxide, silicon nitride, silicon oxynitride or the like oxide of silicon, nitride of silicon or oxynitride, of silicon, or an insulating material including a metal element such as aluminum oxide and titanium nitride. For another example, the first insulating layer 103 and the second insulating layer 106 may also include an organic insulating material such as acrylic acid or polymethyl methacrylate (PMMA).

For example, the first insulating layer 103 and the second insulating layer 106 may be a single layer structure or a multilayer structure including a plurality of insulating material layers, and the embodiments of the present disclosure do not limit the materials and structures of the first insulating layer 103 and the second insulating layer 106.

For example, materials of the first conductive layer 102, the second conductive layer 104 and the third conductive layer 105 include gold (Au), silver (Ag), copper (Cu), aluminum (Al), molybdenum (Mo), magnesium (Mg) or tungsten (W) or an alloy material combined by the above metals, or a conductive metal oxide material such as indium tin oxide (ITO), indium zinc oxide (IZO), zinc oxide (ZnO), zinc aluminum oxide (AZO) or the like.

Figure 4:
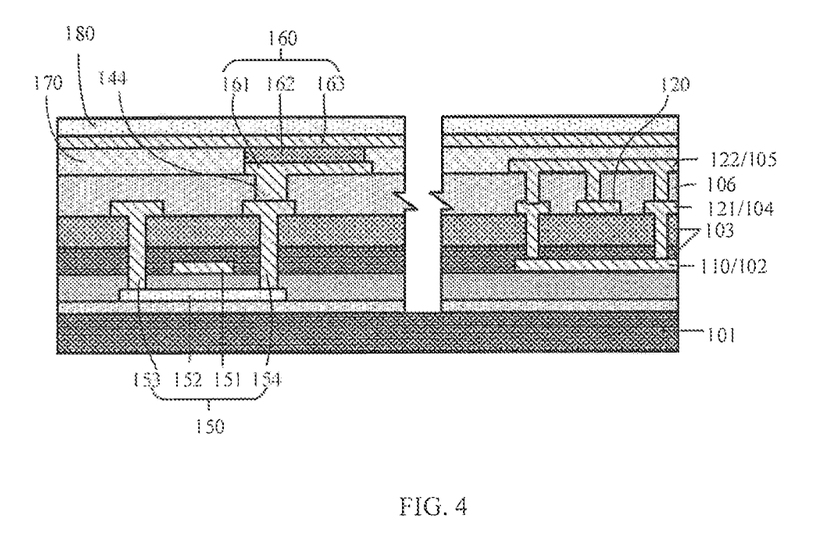
FIG. 4 is a partial cross-sectional view taken along line II-II' of FIG. 2.

FIG. 4 is a partial cross-sectional view of the array substrate according to at least one embodiment of the present disclosure. Hereinafter, taking the case that the array substrate 10 is the array substrate of the OLED display panel as an example, the structural relationship between the connection structure 200 and the sub-pixels will be specifically described with reference to FIG. 4.

Each sub-pixel includes a light-emitting element OLED and a pixel circuit that drives the OLED to emit light. For example, the pixel circuit may include a conventional 2T1C, 3T1C or an OLED pixel circuit which further includes a compensation function, a reset function, etc., which is not limited in the embodiments of the present disclosure.

FIG. 4 is a cross-sectional view of the array substrate 10 in FIG. 2 taken along section line II-II'. For the sake of clarity, only a light-emitting element 160 and a thin film transistor 150 directly connected with the light-emitting element are shown in this cross-sectional view. The thin film transistor 150 is, for example, a driving transistor that drives the light-emitting element 160 to emit light, or a light-emitting control transistor that controls whether a current that drives the light-emitting element 160 to emit light flows through or not, which is not limited in the embodiments of the present disclosure.

As shown in FIG. 4, the light-emitting element 160 includes a first electrode 161, a light-emitting layer 162 and a second electrode 163. Here, the first electrode 161 is a pixel electrode, and the second electrode 163 is a common electrode. One of the first electrode 161 and the second electrode 163 is an anode and the other is a cathode. For example, in at least one example, the light-emitting element 160 may include at least one of a hole injection layer, a hole transport layer, an electron injection layer, an electron transport layer or the like in addition to the light-emitting layer 162.

The thin film transistor 150 includes a gate electrode 151, an active layer 152, a source electrode 153 and a drain electrode 154. The embodiments of the present disclosure do not limit the type, material and structure of the thin film transistor 150. For example, the thin film transistor 150 may be of a top-gate type, a bottom-gate type or the like, and the active layer of the thin film transistor 150 may be amorphous silicon or polysilicon (for example, low temperature polysilicon or high-temperature polysilicon), an oxide semiconductor (for example, IGZO) or the like, and the thin film transistor 150 may be of an N-type or a P-type.

For example, the light-emitting element 160 may be of a top emission, bottom emission or double emission structure. For example, the light-emitting element 160 is of the top emission structure, the first electrode 161 is reflective, and the second electrode 163 is transmissive or semi-transmissive. For example, the first electrode 161 is formed of a transparent conductive oxide material such as indium tin oxide (ITO). For example, the first electrode 161 is formed of a high work function material to serve as an anode, such as an ITO/Ag/ITO laminate structure; the second electrode 163 is formed of a low work function material to serve as a cathode, for example, a semi-transmissive metal or a semi-transmissive metal alloy such as an Ag/Mg alloy material.

As shown in FIG. 4, the first signal line 110 and the gate electrode 151 of the thin film transistor 150 are disposed in a same layer, and the second signal line 120, the first connection part 121 and the source/drain electrode layer (153/154) of the thin film transistor 150 are disposed in a same layer, and the second connection part 122 and the first electrode 161 of the light-emitting element 160 are disposed in a same layer.

For example, the insulating layer between the gate electrode 151 of the thin film transistor 150 and the source/drain electrode layer (153/154) serves as the first insulating layer 103, for example, the first insulating layer 103 is an inter-layer dielectric layer of a two-layer structure.

For example, the second insulating layer 106 serves as a planarization layer of the array substrate 10. The first electrode 161 of the light-emitting element 160 is electrically connected with the source electrode or drain electrode of the thin film transistor through a fourth via hole 144 in the planarization layer.

A pixel defining layer 170 is disposed on the second insulating layer 106 and the third conductive layer 105, and an opening is formed in the pixel defining layer 170 at a position corresponding to the first electrode 161 to at least partially expose the first electrode 161, and in the opening the light-emitting layer 162 is formed. The second electrode 163 is formed on the light-emitting layer 162 and the pixel defining layer 170. As shown in FIG. 4, the second electrode 163 extends to the region where the second connection part 122 is located, but this is not necessary; in another example, the second electrode 163 may expose the second connection part 122.

A protective layer 180 is disposed on the second electrode 163. The protective layer 180 is, for example, an inorganic protective layer or an organic protective layer, or a laminate of an inorganic protective layer and an organic protective layer. Further, a reducing material and/or a hygroscopic material may be included in the protective layer 180 to avoid adverse effects of the oxygen/water vapor on the light-emitting element 160.

The array substrate provided by at least one embodiment of the present disclosure is provided with the first connection part and the second connection part connected with each other, and the first connection part and the second connection part are electrically connected with the first signal line and the second signal line, respectively. Therefore, the interconnection of the first signal line and the second signal line is realized, and the direct short-circuit connection between the first signal line and the second signal line is avoided, and thereby the timely detection and timely repair of the second signal after the second signal line is formed in the manufacturing process are allowed, and product yield is improved as a result.

Figure 5:
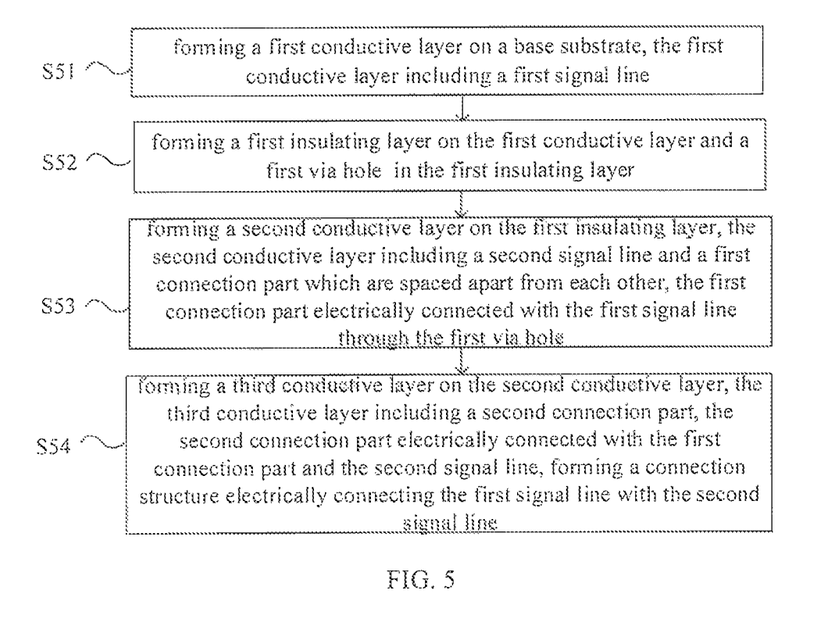
FIG. 5 is a flowchart of a manufacturing method of the array substrate provided by an embodiment of the present disclosure.

At least one embodiment of the present disclosure further provides a manufacturing method of the above array substrate. FIG. 5 is a flow chart of the manufacturing method of the array substrate provided by the embodiment of the present disclosure; and FIG. 6A to FIG. 6E are schematic views showing steps of the manufacturing method of the array substrate according to the embodiment of the present disclosure. The manufacturing method includes at least the following steps S51-S54.

Figure 6A:
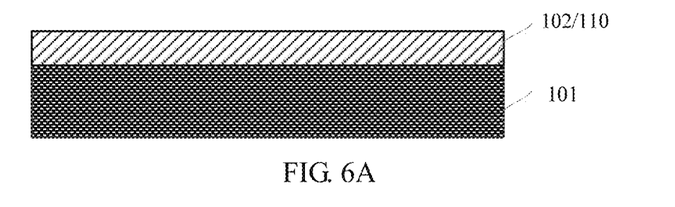
FIG. 6A-6E are schematic views showing steps of the manufacturing method of the array substrate provided by the embodiments of the present disclosure.

Step S51: as shown in FIG. 6A, forming the first conductive layer 102 on the base substrate 101, the first conductive layer including the first signal line 110.

For example, the base substrate 101 may be an inorganic substrate (such as glass, quartz, sapphire, silicon wafer, etc.) or an organic flexible substrate (such as polyimide (PI), polyethylene terephthalate (PET), polycarbonate, polyethylene, polyacrylate, polyetherimide, polyethersulfone, etc.), which is included by but not limited to the embodiments of the present disclosure.

For example, forming the first conductive layer 102 includes forming a first conductive material layer and patterning the first conductive material layer to form the first conductive layer 102 including the first signal line 110. Other conductive structures such as the gate line or the gate electrode of the thin film transistor for the sub-pixel may be formed in the process of forming the first signal line 110.

For example, a material of the first conductive material layer includes gold (Au), silver (Ag), copper (Cu), aluminum (Al), molybdenum (Mo), magnesium (Mg) or tungsten (W) or an alloy material combined by the above metals, or a conductive metal oxide material such as indium tin oxide (ITO), indium zinc oxide (IZO), zinc oxide (ZnO), zinc aluminum oxide (AZO) or the like.

For example, the first conductive material layer may be formed by a process such as sputtering, physical vapor deposition, chemical vapor deposition, or the like.

For example, the patterning process may employ a conventional photolithography process, including photoresist coating, exposure, development, etching, stripping off the photoresist, and the like, which are not described herein.

Figure 6B:
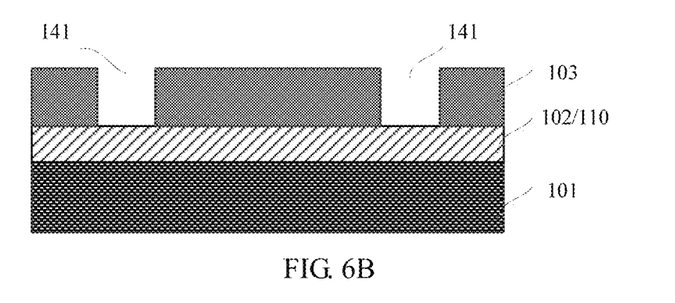

Step S52: as shown in FIG. 6B, forming the first insulating layer 103 on the first conductive layer 102 and the first via hole 141 in the first insulating layer 103.

For example, the first insulating layer 103 may include an inorganic insulating material such as silicon oxide, silicon nitride, silicon oxynitride or the like, or an insulating material including a metal element such as aluminum oxide or titanium nitride. For another example, the first insulating layer 103 may also include an organic insulating material such as acrylic acid or polymethyl methacrylate (PMMA).

For example, the first insulating layer 103 may be a single-layer structure or a multi-layer structure including multiple insulating material layers, which is not limited to the embodiments of the present disclosure.

Figure 6C:
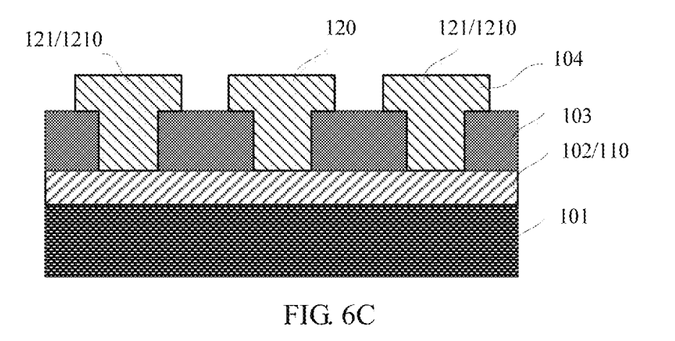

Step S53: as shown in FIG. 6C, forming the second conductive layer 104 on the first insulating layer 103. The second conductive layer 104 includes the second signal line 120 and the first connection part 121 which are spaced apart from each other, and the first connection part 121 is electrically connected with the first signal line 110 through the first via hole 141.

For example, a formation process of the second conductive layer 104 may be referred to the above formation process of the first conductive layer 102, and details are not described herein again. Other conductive structures such as the data line, the detection line, or the source electrode, the drain electrode or the like of the thin film transistor for the sub-pixel may be formed in the process of forming the second signal line 120 and the first connection part 121.

For example, the first connection part 121 includes two sub-connection parts 1210, and the two sub-connection parts 1210 are respectively disposed at two sides of the second signal line 120. For example, the two sub-connection parts 1210 are symmetrically disposed with respect to the second signal line 120.

Step S54: forming the third conductive layer 105 on the second conductive layer 104. The third conductive layer 105 includes the second connection part 122, and the second connection part 122 is electrically connected with the first connection part 121 and the second signal line 120, so that the connection structure 200 electrically connecting the first signal line 110 with the second signal line 120 is formed.

Figure 6D:
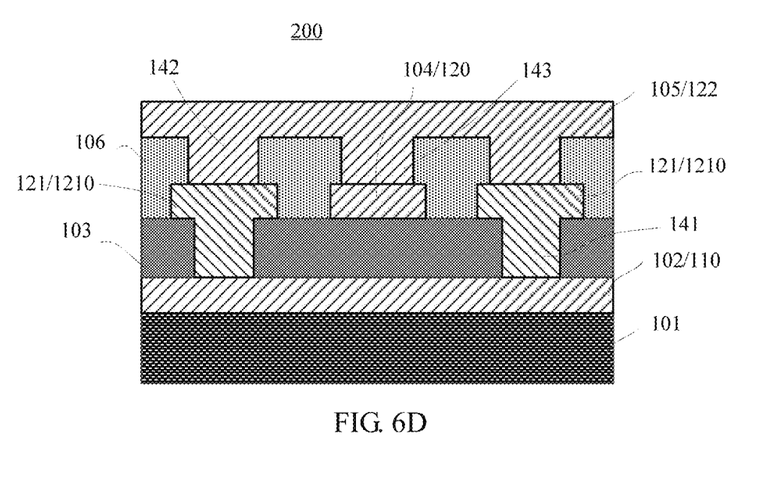

For example, as shown in FIG. 6D, in a specific example of the manufacturing method, the second insulating layer 106 is formed on the second conductive layer 104, the second via hole 142 and the third via hole 143 are formed in the second insulating layer 106, and the second connection part 122 is electrically connected with the first connection part 121 and the second signal line 120 through the second via hole 142 and the third via hole 143 in the second insulating layer 106, respectively. Other conductive structures such as the pixel electrode for the sub-pixel may be formed in the process of forming the third conductive layer 105.

Figure 6E:
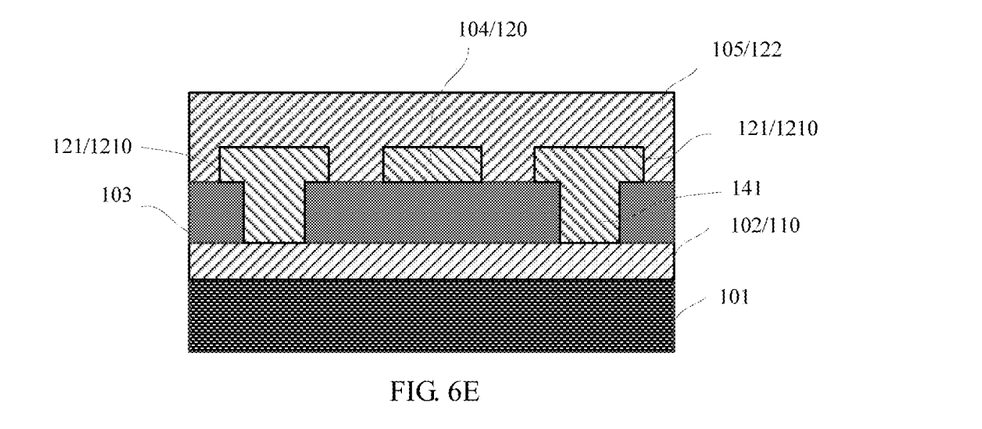

For example, as shown in FIG. 6E, in another specific example of the manufacturing method, the second connection part 122 may be directly formed on the second conductive layer 104 and electrically connected with the first connection part 121 and the second signal line 120 through direct contact by overlapping without via holes (by lap joint, not through the via holes), and no insulating layer is formed between the third conductive layer 105 and the second conductive layer 104.

In the method of the above embodiment, after the second conductive layer 104 is formed and before the third conductive layer 105 is formed, because the second signal line 120 is insulated from the first signal line 110, the second signal line is allowed to be timely detected and timely repaired, which can improve product yield and reduce production costs.

For example, the manufacturing method of the array substrate further includes: detecting whether the second signal line 120 is abnormal in an electrical detection manner after forming the second conductive layer 104 and before forming the third conductive layer 105; repairing the second Signal line 120 if the second signal line 120 is abnormal.

For example, detecting whether the second signal line 120 is abnormal includes: inputting a signal at one end of the second signal line 120; detecting an output signal at the other end of the second signal line 120; if the output signal is smaller than a predetermined value, determining that the second signal line 120 is abnormal.

Because the second signal line 120 is not connected with the first signal line 110 at this time, if there is no abnormity such as a short circuit or an open circuit at the second signal line 120, an intensity of the detected output signal of the second signal line 120 is approximately equal to an intensity of the input signal; and if there is an abnormity at the second signal line 120, the intensity of the output signal is significantly lower than the intensity of the input signal, for example, smaller than one tenth of the intensity of the input signal. For example. For example, if there is a short circuit abnormity at the second signal line 120, the signal is dispersed through a short circuit path, and the detected output signal is significantly lower than intensity of the input signal; if there is an open circuit abnormity at the second signal line 20, the signal transmission is blocked, and almost no output signal is detected.

For example, a first capacitor is formed by a first detecting electrode and one end of the second signal line 120, and a signal is input to the first detecting electrode; a second capacitor is formed by a second detecting electrode and the other end of the second signal line 120, and an output signal of the second detecting electrode is detected.

For example, the input signal is a high frequency voltage pulse signal having a frequency of, for example, higher than 3 MHz.

For example, the first conductive layer 102 includes the plurality of first signal lines 110 extended along the first direction D1, and the second conductive layer 104 includes the plurality of second signal lines 120 extended along the second direction D2; the plurality of first signal lines 110 and the plurality of second signal lines 120 overlap each other at overlap positions, respectively, in the direction perpendicular to the array substrate 110, and the above-described connection structure is formed at each overlap position, thereby enabling the first signal lines 110 and the second signal lines 120 connected with each other to form the conductive mesh structure.

For example, the manufacturing steps described above can be performed synchronously with forming other structures in the array substrate, thereby saving process. For example, referring to FIG. 2 and FIG. 4 together, the first signal line 110 and the scan line 111 may be formed by a same deposition process and by a same patterning process; the second signal line 120, the first connection part 121 and the source/drain electrode layer (153/154) may be formed by a same deposition process and by a same patterning process.

For example, the second connection part 122 and the pixel electrode of the sub-pixel (for example, the first electrode 161 in FIG. 4) may be formed by a same deposition process and formed a the same patterning process, that is, the pixel electrode is formed in the third conductive layer 105.

For example, the first via hole 141 and the source/drain contact holes may be funneled in one patterning process, and the second via hole 142, the third via hole 143 and the fourth via hole 144 may be formed in one patterning process.

With continued reference to FIG. 4, after forming the third conductive layer 105, the pixel defining layer 170, the protective layer 180 and the like may be formed on the third conductive layer 105.

The obtained array substrate can be combined with an opposite substrate such as a cover plate or a color filter substrate to form a display panel, and then a cutting process may be performed to remove an auxiliary region which occurs in the manufacturing process, such as the detection region or the like.

The array substrate provided by the embodiments of the present disclosure is provided with the first connection part and the second connection part connected with each other, and the first connection part and the second connection part are respectively electrically connected with the first signal line and the second signal line, so that the interconnection between the first signal line and the second signal line is realized, and the direct short-circuit connection between the first signal line and the second signal line is avoided, thereby allowing the timely detection and timely repair of the second signal line after the second signal line is formed, and thereby improving product yield and reducing production costs. In addition, the first connection part, the second connection part, the first via hole, the second via hole and the third via hole may be formed together with the original structures in the array substrate, without an additional process step, and the operation is facilitated.

Figure 7:
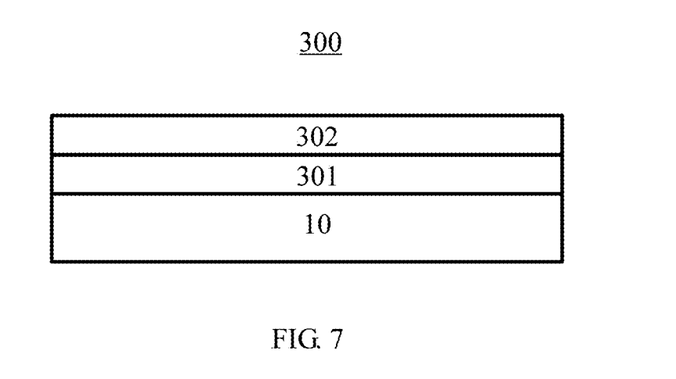
FIG. 7 is a schematic view of a display panel provided by the embodiments of the present disclosure.

As shown in FIG. 7, the embodiments of the present disclosure further provide a display panel 300 including the array substrate 10 described above. For example, the display panel is an OLED display panel, the array substrate included by the display panel is accordingly an OLED array substrate, and the light-emitting element included by the sub-pixel is an OLED. For example, the display panel further includes an encapsulation layer 301 and a cover plate 302 disposed on the array substrate 10, and the encapsulation layer 301 is configured to seal the light-emitting element 160, so as to prevent external moisture and oxygen from penetrating into the light-emitting element and the pixel circuit and causing damage to the device. For example, the encapsulation layer 301 includes an organic thin film or a structure including organic thin films and inorganic thin films which are alternately laminated. For example, a water absorbing layer (not shown) may be disposed between the encapsulation layer 301 and the array substrate 10 and is configured to absorb water vapor or sol remaining in the pre-production process of the light-emitting element 160. The cover plate 302 is, for example, a glass cover. For example, the cover plate 302 and the encapsulation layer 301 may be of a one-piece structure.

In another example, the display panel 300 is a liquid crystal display panel. The display panel 300 further includes a color filter substrate which is opposite to the array substrate and a liquid crystal layer disposed between the array substrate and the color filter substrate.

Embodiments of the present disclosure also provide a display device including the above array substrate or display panel. The display device may be, for example, a liquid crystal display device, an OLED display device, or any product or component having a display function such as an electronic paper, a digital photo frame, a mobile phone, a tablet computer, a display, a notebook computer, a navigator, or the like.

Although the present disclosure has been described in detail with reference to the above general description and the specific embodiments of the present disclosure, it will be apparent to those skilled in the art to make modifications or improvements on the basis of the embodiments of the present disclosure. Therefore, such modifications or improvements made without departing from the spirit of the present disclosure are intended to fall within the scope of the present disclosure.

What is claimed is:

1. An array substrate, comprising a base substrate and a first conductive layer, a first insulating layer, a second conductive layer, and a third conductive layer which are sequentially stacked on the base substrate, wherein the first insulating layer insulates the first conductive layer from the second conductive layer, the first conductive layer comprises a first signal line, the second conductive layer comprises a second signal line and a first connection part which are spaced apart from each other, and the third conductive layer comprises a second connection part;

the first connection part is electrically connected with the first signal line through a first via hole in the first insulating layer;

the second connection part is electrically connected with the first connection part and the second signal line, to constitute a connection structure electrically connecting the first signal line with the second signal line;

an orthographic projection of the second signal line on the base substrate is intersected with an orthographic projection of the first signal line on the base substrate; and the first connection part is in contact with an upper surface of the first insulating layer, wherein the first conductive layer comprises a plurality of first signal lines extended in a first direction, and the second conductive layer comprises a plurality of second signal lines extended in a second direction;

the plurality of first signal lines and the plurality of second signal lines overlap each other at overlap positions, respectively, in the direction perpendicular to the base substrate, and the connection structure is provided at each of the overlap positions;

the second direction intersects the first direction, the array substrate further comprising a plurality of sub-pixels arranged in a plurality of rows along the first direction and a plurality of columns along the second direction, wherein each sub-pixel comprises a thin film transistor, and the first signal line and the second signal line are electrically connected with a source electrode or a drain electrode of the thin film transistor; each sub-pixel further comprises a pixel electrode, and the third conductive layer further comprises the pixel electrode.

2. The array substrate according to claim 1, further comprising a second insulating layer between the second conductive layer and the third conductive layer, wherein the second connection part is electrically connected with the first connection part through a second via hole and with the second signal line through a third via hole, respectively, and the second via hole and the third via hole are in the second insulating layer.

3. The array substrate according to claim 2, wherein in the direction perpendicular to the base substrate, the third via hole is at least partially overlapped with the first signal line.

4. The array substrate according to claim 1, wherein the first signal line and the second signal line belong to a first power supply line which is configured to provide a power supply voltage; or the first signal line and the second signal line belong to a common electrode line which is configured to provide a common voltage.

5. The array substrate according to claim 1, wherein the first connection part comprises two sub-connection parts, and the two sub-connection parts are respectively at two sides of the second signal line.

6. The array substrate according to claim 5, wherein in a direction perpendicular to the base substrate, the two sub-connection parts are respectively at least overlapped with the second connection part and are respectively electrically connected with the second connection part.

7. The array substrate according to claim 1, further comprising a second insulating layer between the second conductive layer and the third conductive layer, wherein both the first connection part and the second signal line are on a side of the second insulating layer close to the first insulating layer;

for the connection structure, the second connection part is electrically connected with the first connection part through a second via hole and with the second signal line through a third via hole, respectively, and the second via hole and the third via hole are in the second insulating layer.

8. The array substrate according to claim 1, wherein
the plurality of first signal lines and the plurality of second signal lines belong to a first power supply line which is configured to provide a power supply voltage for the plurality of sub-pixels; or the plurality of first signal lines and the plurality of second signal lines belong to a common electrode line which is configured to provide a common voltage for the plurality of sub-pixels.

9. The array substrate according to claim 1, wherein, for the connection structure, the first connection part comprises two sub-connection parts, and the two sub-connection parts are respectively at two sides of the second signal line.

10. The array substrate according to claim 1,
wherein the first conductive layer further comprises a plurality of scan lines extended along the first direction, and the plurality of scan lines are configured to respectively provide scan signals to the plurality of rows of sub-pixels.

11. The array substrate according to claim 1,
wherein the second conductive layer further comprises a plurality of data lines extended along the second direction, and the plurality of data lines are configured to respectively provide data signals to the plurality of columns of sub-pixels.

12. The array substrate according to claim 1, wherein the second connection part is electrically connected with the first connection part and the second signal line through direct contact by overlapping without via holes.

13. A display panel comprising the array substrate according to claim 1.

14. The array substrate according to claim 1, wherein the second signal line is longer than the first connection part in an extension direction of the second signal line.

15. The array substrate according to claim 1, wherein the second signal line is not directly electrically connected with the first signal line, and is electrically connected with the first signal line through the first connection part and the second connection part.

16. A manufacturing method of an array substrate, comprising:
forming a first conductive layer on a base substrate, wherein the first conductive layer comprises a first signal line;

forming a first insulating layer on the first conductive layer and a first via hole in the first insulating layer;

forming a second conductive layer on the first insulating layer, wherein the second conductive layer comprises a second signal line and a first connection part which are spaced apart from each other, and the first connection part is electrically connected with the first signal line through the first via hole; an orthographic projection of the second signal line on the base substrate is intersected with an orthographic projection of the first signal line on the base substrate; and the first connection part is in contact with an upper surface of the first insulating layer; and forming a third conductive layer on the second conductive layer, wherein the third conductive layer comprises a second connection part, and the second connection part is electrically connected with the first connection part and the second signal line, respectively, to constitute a connection structure electrically connect the first signal line with the second signal line, wherein the first conductive layer comprises a plurality of first signal lines extended in a first direction, and the second conductive layer comprises a plurality of second signal lines extended in a second direction;

wherein the plurality of first signal lines and the plurality of second signal lines overlap each other at overlap positions respectively, in the direction perpendicular to the base substrate, and the connection structure is provided at each of the overlap positions;

the second direction intersects the first direction;

the array substrate further comprises a plurality of sub-pixels arranged in a plurality of rows along the first direction and a plurality of columns along the second direction;

each sub-pixel comprises a thin film transistor, and the first signal line and the second signal line are electrically connected with a source electrode or a drain electrode of the thin film transistor; and each sub-pixel further comprises a pixel electrode, and the third conductive layer further comprises the pixel electrode.

17. The manufacturing method according to claim 14, further comprising:
- detecting by an electrical detection manner whether the second signal line is abnormal after forming the second conductive layer and before forming the third conductive layer; and
- repairing the second signal line in a situation where the second signal line is abnormal.

18. The manufacturing method according to claim 17, wherein detecting by the electrical detection manner whether the second signal line is abnormal comprises:
- inputting a signal at an end of the second signal line;
- detecting an output signal at another end of the second signal line;
- in a situation where the output signal is smaller than a predetermined value, determining that the second signal line is abnormal.

\* \* \* \* \*